(12) United States Patent
Harada et al.

(10) Patent No.: US 6,884,516 B2
(45) Date of Patent: *Apr. 26, 2005

(54) INTERNAL MEMBER FOR PLASMA-TREATING VESSEL AND METHOD OF PRODUCING THE SAME

(75) Inventors: Yoshio Harada, Hyogo (JP); Junichi Takeuchi, Hyogo (JP); Tatsuya Hamaguchi, Kanagawa (JP); Nobuyuki Nagayama, Yamanashi (JP); Kouji Mitsuhashi, Yamanashi (JP)

(73) Assignees: Tocalo Co., Ltd., Hyogo (JP); Tokyo Electron Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/849,797

(22) Filed: May 21, 2004

(65) Prior Publication Data

US 2004/0214026 A1 Oct. 28, 2004

Related U.S. Application Data

(62) Division of application No. 09/890,251, filed as application No. PCT/JP00/08584 on Dec. 4, 2000, now Pat. No. 6,783,863.

(30) Foreign Application Priority Data

Dec. 10, 1999 (JP) ............................................ 11-351546

(51) Int. Cl.$^7$ .............................. H01L 21/00; B32B 3/10
(52) U.S. Cl. ......................... 428/469; 428/610; 428/613; 428/623; 428/633; 428/701; 427/453; 427/454; 427/455; 427/456
(58) Field of Search .............................. 428/469, 701, 428/610, 613, 623, 633; 427/453, 454, 455, 456

(56) References Cited

U.S. PATENT DOCUMENTS

| | | | |
|---|---|---|---|
| 6,120,640 A | | 9/2000 | Shih et al. |
| 6,383,964 B1 | * | 5/2002 | Nakahara et al. ........... 501/152 |
| 6,738,863 B1 | | 5/2004 | Butterworth et al. |
| 6,783,863 B1 | | 8/2004 | Harada et al. |

FOREIGN PATENT DOCUMENTS

| | | | |
|---|---|---|---|
| JP | 64-039728 | * | 2/1989 |
| JP | 3-115535 | * | 5/1991 |
| JP | 5-117064 | * | 5/1993 |
| JP | 5-238859 | * | 9/1993 |
| JP | 6-057396 | * | 3/1994 |
| JP | 6-136505 | * | 5/1994 |
| JP | 6-142822 | * | 5/1994 |
| JP | 7-126827 | * | 5/1995 |
| JP | 7-176524 | * | 7/1995 |
| JP | 8-037180 | * | 2/1996 |
| JP | 8-339895 | * | 12/1996 |
| JP | 9-069554 | * | 3/1997 |
| JP | 9-272987 | * | 10/1997 |
| JP | 10-4083 | * | 1/1998 |
| JP | 10-45461 | * | 2/1998 |
| JP | 10-45467 | * | 2/1998 |
| JP | 10-251871 | | 9/1998 |
| JP | 11-080925 | * | 3/1999 |
| JP | 11-207161 | * | 2/2001 |
| JP | 2001-31484 | * | 2/2001 |

OTHER PUBLICATIONS

JIS Using Series, "Spraying Techniques Manual", p. 95 (Oct. 30, 1998, Japanese Standard Association), with English Translation.*
English Language Abstract of JP 10–4083.
English Language Abstract of JP 10–45467.
English Language Abstract of JP 5–117064.
English Language Abstract of JP 10–45461.
English Language Abstract of JP 2001–31484.
English Language Abstract of JP Appln. No. 06–136505.
English Language Abstract of JP Appln. No. 08–037180.
English Language Abstract of JP Appln. No. 05–238859.
English Language Abstract of JP Appln. No. 09–272987.
English Language Abstract of JP Appln. No. 09–069554.
English Language Abstract of JP Appln. No. 06–057396.
English Language Abstract of JP Appln. No. 64–039728.
English Language Abstract of JP Appln. No. 8–339895.
English Language Abstract of Jp Appln. No, 07–176524.
English Language Abstract of JP Appln. No. 06–142822.
English Language Abstract of JP Appln. No. 11–080925.
English Language Abstract of JP Appln. No. 03–115535.
English Language Abstract of JP Appln. No. 07–126827.
English Language Abstract of JP 10–251871, published Sep. 22, 1998.

* cited by examiner

*Primary Examiner*—Deborah Jones
*Assistant Examiner*—Jason Savage
(74) *Attorney, Agent, or Firm*—Greenblum & Bernstein, P.L.C.

(57) ABSTRACT

It is to propose an internal member for a plasma treating vessel having excellent resistances to chemical corrosion and plasma erosion under an environment containing a halogen gas and an advantageous method of producing the same, which is a member formed by covering a surface of a substrate with a multilayer composite layer consisting of a metal coating formed as an undercoat, $Al_2O_3$ film formed on the undercoat as a middle layer and $Y_2O_3$ sprayed coating formed on the middle layer as a top coat.

30 Claims, No Drawings

INTERNAL MEMBER FOR PLASMA-TREATING VESSEL AND METHOD OF PRODUCING THE SAME

CROSS-REFERENCE TO RELATED APPLICATION

The present application is a continuation of U.S. application Ser. No. 09/890,251, filed Dec. 4, 2000, now U.S. Pat. No. 6,783,863, which is the National Stage of PCT/JP00/08584, filed Dec. 4, 2000, which was not published in English under PCT Article 21(2), and which are hereby incorporated by reference in their entireties. The present application claims priority of Japanese Application No. 11-351546 filed Dec. 10, 1999.

TECHNICAL FIELD

This invention relates to an internal member for plasma-treating vessel having an excellent resistance to plasma erosion and a method of producing the same.

Particularly, the invention is a technique capable of applying to members used in a plasma treatment under a plasma environment using a treating gas containing a halogen element such as deposit shield, baffle plate, focus ring, insulator ring, shield ring, bellows cover, electrode and so on.

Moreover, the invention is applicable to internal parts for plasma-treating vessels in a field of a semiconductor manufacturing device, a manufacturing apparatus for a liquid crystal device or the like.

BACKGROUND ART

In general, a fluoride such as $BF_3$ or $NF_3$, a chloride such as $BCl_3$ or $SnCl_4$, a bromide such as HBr, or the like is used as a treating gas for various treatments in the manufacturing process of semiconductors, liquid crystal devices and the like, so that there is a problem that parts in the treating vessel are considerably corroded and damaged.

For instance, as a material used in the plasma-treating vessel for the semiconductor manufacturing apparatus, there are known a metallic material such as Al, Al alloy or the like, an anodized oxide film of Al covering the surface of the metallic material, a sprayed coating such as boron carbide or the like, a sintered body film of $Al_2O_3$, $Si_3N_4$ or the like, and a high polymer film of fluorine resin, epoxy resin or the like. These materials are known to be subjected to a chemical damage when being contacted with a halogen ion indicating a strong corrosive property, or to an erosion damage through fines particles of $SiO_2$ and $Si_3N_4$ and an ion excited by a plasma.

Especially, a plasma is frequently used for more activating the reaction in the process using a halogen compound. However, the halogen compound is dissociated to atomic F, Cl, Br, I or the like indicating a very strong corrosive property under an environment using such a plasma. Even in this case, if a finely divided solid of $SiO_2$, $Si_3N_4$, Si, W or the like is existent in such an environment, the member used in the plasma-treating vessel is strongly subjected to not only the chemical corrosion but also the erosion damage through the above fine particles.

And also, the environment excited by the plasma is ionized even by a gas having no corrosive property such as Ar gas to cause a phenomenon of strongly impinging to a solid face (ion bombardment), so that various members arranged in the above vessel are subjected to a stronger damage.

Heretofore, there was a method of forming a thin $Al_2O_3$ film or the like as a technique adopted when being subjected to such a chemical corrosion or erosion damage. However, such a technique has the following problems.

(1) With respect to a material covered with $Al_2O_3$ film (alumite) by subjecting Al and Al alloy to an anodization to provide corrosion resistance, there is a problem that the service life becomes shorter when being subjected to plasma erosion in an environment containing a halogen gas. And also, since it is an Al-containing film, $AlF_3$ particles are created, which bring about a fear of degrading quality of semiconductor product manufactured.

(2) There is a technique that a dense film of oxide, carbide, nitride, fluoride or the like of Group 3 $a$ element in the Periodic Table such as Sc, Y, La, Ce, Yb, Eu, Dy or the like is formed on the surface of a part through PVD or CVD process, or a single crystal of $Y_2O_3$ is applied thereto (JP-A-10-4083). However, this technique has problems that the film forming rate is slow and the productivity is poor and plural film members (composite film) can not simultaneously be formed.

It is, therefore, an object of the invention to propose a surface-treated member for plasma-treating vessel or the like having large resistances to damage due to chemical corrosion and damage through plasma erosion under environment containing a halogen gas as well as a method of producing the same.

DISCLOSURE OF THE INVENTION

The invention solves the aforementioned problems and drawbacks of the conventional techniques by adopting means as mentioned below. That is, the construction of the invention is as follows:

(1) A cover member comprising a substrate and a layer of $Y_2O_3$ sprayed coating having a porosity of 0.2–10% and a thickness of 50–2000 $\mu$m formed on a surface of the substrate through a thermal spraying process.

(2) A cover member comprising a substrate, and a composite layer consisting of a coating of one or more metals or alloys selected from Ni and an alloy thereof, W and an alloy thereof, Mo and an alloy thereof and Ti and an alloy thereof, which are excellent in an adhesion property to $Y_2O_3$ sprayed coating, formed at a thickness of 50–500 $\mu$m as an undercoat on a surface of the substrate under a plasma generating condition in an environment containing a halogen compound through, preferably, a thermal spraying process and a $Y_2O_3$ sprayed coating formed at a thickness of 50–2000 $\mu$m on the undercoat in case of an environment having a strong corrosion property.

(3) A cover member comprising a substrate and a multi-layer composite layer consisting of the above metal coating (preferably sprayed coating) formed on a surface of the substrate as an undercoat, a $Al_2O_3$ coating (preferably sprayed coating) formed on the undercoat as a middle layer and the above $Y_2O_3$ sprayed coating formed on the middle layer as a topcoat through thermal spraying in case of an environment having a strong corrosion property.

(4) A cover member comprising a substrate and a multi-layer composite layer consisting of the above metal coating (preferably sprayed coating) formed on a surface of the substrate as an undercoat, a film of $Al_2O_3$ and $Y_2O_3$ (preferably sprayed coating) formed on the undercoat as a middle layer and the above $Y_2O_3$ sprayed coating formed on the middle layer as a topcoat through thermal spraying in case of an environment having a strong corrosion property.

(5) A cover member is covered with the $Y_2O_3$ sprayed coating directly formed on the surface of the substrate or indirectly formed through the undercoat or middle layer in the above method, wherein the sprayed coating is obtained by using $Y_2O_3$ powder having a purity of not less than 95% and adopting a spraying method selected from plasma-spraying the powder in air, plasma-spraying in an Ar gas containing no oxygen under a reduced pressure, high-speed flame spraying, explosion spraying and the like.

Among them, the method of plasma-spraying under the reduced pressure of Ar gas is also effective for the improvement of the corrosion resistance.

BEST MODE FOR CARRYING OUT THE INVENTION

The inventors have made studies in order to solve the aforementioned problems of the conventional techniques and confirmed that the damage of the internal member for the plasma-treating vessel is a damage due to chemical corrosion through a halogen gas and a damage due to plasma erosion. And also, it has been found that when the member is used in an environment containing the halogen excited by the plasma, it is important to prevent the damage caused by the resistance to the plasma erosion, which is then effective to prevent the chemical corrosion.

To this end, the inventors have made mainly the formation of the coating effective for the resistance to plasma erosion. As a result, the above member according to the invention is developed.

That is, the invention adopted as means for solving the above subject is fundamentally a member obtained by forming a sprayed coating consisting of only $Y_2O_3$ on a surface of a substrate such as metal, ceramic, carbon material or the like through thermal spraying process. In case of a strong corrosive environment using the above member, there is developed a member obtained by forming an undercoat of a metal having a strong resistance to halogen gas corrosion beneath the above $Y_2O_3$ sprayed coating and further forming a middle layer of $Al_2O_3$ or $Y_2O_3$.

The construction of the member according to the invention is described in detail below.

(1) Substrate

As a substrate for forming the sprayed coating, various steels inclusive of stainless steel, aluminum and aluminum alloy, tungsten and tungsten alloy, titanium and titanium alloy, molybdenum and molybdenum alloy, carbon and oxide or non-oxide ceramic sintered body, a carbonaceous material and the like are favorable.

Moreover, copper and copper alloy are unfavorable because they are subjected to plasma erosion or corrosion through a halogen compound to bring about environmental contamination. Therefore, if the use of copper or copper alloy is required in view of apparatus construction, they are required to be covered with Cr, Ni or the like by electrolytic plating, chemical plating, vapor deposition or the like.

(2) Construction of Sprayed Coating

The sprayed coating is preferable to be formed on the surface of the substrate by subjecting the substrate to a shot blast treatment and then directly thermal spraying $Y_2O_3$, or by forming a film or sprayed coating of a metal material having a strong resistance to corrosion through a halogen gas as an undercoat layer on the surface of the substrate by PVD treatment, CVD treatment or thermal spraying treatment and then spraying $Y_2O_3$ powder on the undercoat as a top coat. In the latter case, the film thickness of the metal undercoat (sprayed coating or the like) is within a range of 50–500 $\mu$m. When the undercoat layer is thinner than 50 $\mu$m, the action and effect as the undercoat become weak, while when it exceeds 500 $\mu$m, the effect is saturated and there is no meaning on the thickening.

As the metal material for the undercoat, nickel and nickel alloy, tungsten and tungsten alloy, molybdenum and molybdenum alloy, titanium and titanium alloy and so on are preferable.

On the other hand, the $Y_2O_3$ sprayed coating as a top coat is favorable to have a thickness of 50–2000 $\mu$m even when it is directly formed on the surface of the substrate or when it is sprayed onto the undercoat to form a composite layer or further when $Al_2O_3$ or $Al_2O_3+Y_2O_3$ coated film is formed as a middle layer. Because, when the thickness is less than 50 $\mu$m, the effect on the prevention of the damage due to the plasma erosion is poor, while when it exceeds 2000 $\mu$m, the effect is saturated and there is no meaning in the economical reason.

Moreover, the porosity of the $Y_2O_3$ sprayed coating as a top coat is preferably within a range of 0.5–10%. It is difficult to produce the sprayed coating having the porosity of less than 0.5% by the spraying method, while the coating having the porosity of more than 10% is poor in the corrosion resistance and the resistance plasma erosion.

(3) $Y_2O_3$ Sprayed Coating as an Outermost Layer on Member

A most characteristic construction of the invention lies in that $Y_2O_3$ is adopted as a material indicating the resistance to plasma erosion in an environment containing a halogen gas and formed as a sprayed coating layer as a structure of an outermost surface layer of the substrate. As a result of the inventors' studies, it has been found that since $Y_2O_3$ has a specific gravity of 4.84 and a melting point of 2410° C. and is strong in the chemical bonding force to oxygen, it maintains a stable state even if the action of plasma erosion is suffered in the atmosphere containing the halogen gas. In this case, however, it is required to use $Y_2O_3$ having a purity of not less than 95%. If an impurity such as Fe, Mg, Cr, Al, Ni, Si or the like is contained as an oxide, the erosion resistance is unfavorably lowered. The purity is more favorable to be not less than 98%.

Moreover, $Al_2O_3$ as a middle layer formed just beneath the $Y_2O_3$ sprayed coating is chemically stable and less in the change under environment of plasma spraying at atmospheric pressure or plasma spraying under a reduced pressure and serves to compensate the resistance to plasma erosion of $Y_2O_3$.

(4) Coating Method a. Formation of Sprayed Coating

In the invention, $Y_2O_3$ coating as a top coat in at least outermost layer is a sprayed coating. Further, it is preferable that the whole structure of the coating is rendered into the following multilayer structure in order to strengthen the sprayed coating of the top coat.

That is, an undercoat of a metal sprayed coating is formed on the surface of the substrate and $Al_2O_3$ sprayed coating or a mixture sprayed coating of $Al_2O_3$ and $Y_2O_3$ in the gradient compounding is formed thereon as a middle layer and further $Y_2O_3$ sprayed coating is formed thereon as a top coat.

The reason why the above coating structure is preferable is due to the fact that by forming as the middle layer $Al_2O_3$ having excellent corrosion resistance and resistance to plasma erosion as compared with the metal sprayed coating is rendered the sprayed coating into a multilayer structure, and the through-holes of the coating is decreased to improve the corrosion resistance and the resistance to erosion. Furthermore, $Al_2O_3$ as the middle layer develops good adhesion property to both of the undercoat and the top coat. In this meaning, the middle layer is favorable to be a mixture layer of $Al_2O_3$ and $Y_2O_3$. In this case, the mixture layer is favorable to be based on the gradient compounding that the $Al_2O_3$ concentration at the undercoat side becomes high and the $Y_2O_3$ concentration at the top coat side becomes high. The formation of such a middle layer can easily be carried out by adopting a spraying process, so that it is said to be a preferable embodiment that the middle layer is formed as a sprayed coating. Moreover, the thickness of the middle layer is favorable to be within the same range as the $Y_2O_3$ sprayed coating of the top coat.

In the invention, a plasma spraying process under an atmospheric pressure or a plasma spraying process in an atmosphere containing substantially no oxygen is favorable for forming a sprayed coating of metal or $Al_2O_3$ or $Y_2O_3$, but it is also possible to conduct a high-speed flame spraying process or an explosion spraying process.

b. Formation of Undercoat, Middle Layer Through CVD Process or PVD Process

In the CVD process, steam of a halogen compound of a desired metal is reduced by hydrogen or the like and then oxidized by oxygen or an oxygen compound, and changed into an oxide film by heating in air.

In the PVD process, a sintered body or powder is used as a starting material and evaporated by irradiating an electron beam to precipitate onto the surface of the substrate to form a film.

In general, the formation of the film through CVD process or PVD process is suitable for forming thin film (e.g. about 50 μm).

(5) Environment Using the Member According to the Invention

The $Y_2O_3$ sprayed coating covered onto the surface of the member according to the invention is particularly useful for the use under plasma environment generated in an atmosphere containing a halogen compound.

Of course, the invention is effective even to a plasma erosion action in an environment containing no halogen element or halogen compound such as $N_2$, $H_2$ or the like. In this case, erosion damage becomes gentle as compared with the environment containing the halogen element or compound, so that the sprayed coating member according to the invention develops a stable performance over a long time.

EXAMPLE

Example 1

In this example, a one-side surface of an aluminum test piece (size: width 50 mm×length 50 mm×thickness 5 mm) is roughened by a shot blast treatment and $Y_2O_3$ sprayed coating having a thickness of 300 μm is formed by using $Y_2O_3$ spraying material through a plasma spraying process under an atmospheric pressure or a plasma spraying process under a reduced pressure controlled to an atmosphere pressure of 50–200 hPa with Ar gas, respectively.

And also, an undercoat of Ni-20% Al alloy is formed on a one-side surface of an aluminum test piece at a thickness of 100 μm by a plasma spraying process under an atmospheric pressure and the above $Y_2O_3$ is formed thereon at a thickness of 300 μm as a top coat.

Thereafter, the porosity and adhesion strength of the $Y_2O_3$ sprayed coating formed on the surfaces of these test pieces are measured and thermal shock test (test of repeating a cycle of an operation that the piece is heated in an electric furnace held at 500° C. for 20 minutes and cooled in air at the outside of the furnace 10 times) is conducted. Moreover, $Al_2O_3$ sprayed coatings formed under the same conditions at the same steps as mentioned above are used as a comparative example.

The test results are shown in Table 1.

All of the coatings according to the invention, i.e. $Y_2O_3$ sprayed coatings directly coated on the surface of the test piece (Nos. 1, 3) and $Y_2O_3$ sprayed coatings formed on the undercoat (Nos. 2, 4) show good adhesion property and resistance to thermal shock, which are in no way inferior to those of the $Al_2O_3$ film. Particularly, the $Y_2O_3$ coating formed by the plasma spraying process under a reduced pressure is smaller in the porosity as compared with that of the coating formed by the spraying process under an atmospheric pressure and can expect the good corrosion resistance.

TABLE 1

| No. | Spraying Process | Structure of coating Under coat | Structure of coating Top coat | Porosity (%) | Adhesion strength (MPa) | Visual appearance in thermal shock test | Remarks |
|---|---|---|---|---|---|---|---|
| 1 | Atmospheric plasma spray | None | $Y_2O_3$ | 5~9 | 35~38 | No peeling | Example |
| 2 | | Ni—20Al | $Y_2O_3$ | 6~8 | 38~41 | No peeling | |
| 3 | Low pressure plasma spray | None | $Y_2O_3$ | 0.2~3 | 40~41 | No peeling | |
| 4 | | Ni—20Al | $Y_2O_3$ | 0.3~4 | 40~44 | No peeling | |
| 5 | Atmospheric plasma spray | None | $Al_2O_3$ | 8~12 | 38~42 | No peeling | Comparative Example |
| 6 | | Ni—20Al | $Al_2O_3$ | 9~12 | 35~44 | No peeling | |
| 7 | Low pressure plasma spray | None | $Al_2O_3$ | 0.5~5 | 38~44 | No peeling | |
| 8 | | Ni—20Al | $Al_2O_3$ | 0.6~7 | 39~43 | No peeling | |

(Note)
(1) Coating thickness: undercoat 100 μm, top coat 300 μm
(2) Adhesion strength is according to a test method of adhesion strength defined in test method of ceramic coating in JIS H8666
(3) Thermal shock test: 500° C. × 20 min → room temperature (air cooling) observation of appearance after repetition 10 times.

Example 2

In this example, an aluminum substrate of 50 mm×100 mm×5 mm thickness is used and subjected to a surface treatment as shown in Table 2 and a test piece having a size of 20 mm×20 mm×5 mm is cut out from the substrate and a portion is masked so as to expose the surface treated face in a range of 10 mm×10 mm and irradiated for 20 hours under the following conditions and measured is a damage quantity through plasma erosion as a reduced thickness.

(1) Environmental Gas and Flow Rate Condition

A mixed gas of $CF_4$, Ar and $O_2$ is an atmosphere under the condition.

$CF_4/Ar/O_2$=100/1000/10 (flow rate cm3 per 1 minute)

(2) Plasma Irradiation Output

High frequency power: 1300 W
Pressure: 133.3 Pa

The test results are shown in Table 2. As seen from the results of Table 2, the anodized film (No. 8) of a comparative example (existing technique) and $B_4C$ sprayed coating (No. 10) are large in the damage quantity through the plasma erosion and are not put into practical use. Moreover, the $Al_2O_3$ coating (No. 9) shows a relatively good resistance to plasma erosion among the comparative examples.

On the contrary, the $Y_2O_3$ sprayed coatings according to the invention develop a very excellent resistance to plasma erosion and maintain good performances even in an environment containing a halogen compound.

TABLE 2

| No. | Sprayed materials | Surface treatment | Presence or absence of undercoat | Damaged depth through erosion (μm) | Remarks |
|---|---|---|---|---|---|
| 1 | $Y_2O_3$ | Spraying | Presence | 6.2 | Example |
| 2 | (99.9%) | | Absence | 6.1 | |
| 3 | $Y_2O_3$ | Spraying | Presence | 7.6 | |
| 4 | (99.8%) | | Absence | 7.2 | |
| 5 | $Y_2O_3$ | Spraying | Presence | 6.5 | |
| 6 | (99.5%) | | Absence | 6.3 | |
| 7 | $Y_2O_3$ (99.9%) | PVD | Absence | 6.6 | Comparative example |
| 8 | $Al_2O_3$ | Anodizing | Absence | 39.5 | |
| 9 | $Al_2O_3$ | Spraying | Presence | 8.1 | |
| 10 | $B_4C$ | Spraying | Presence | 28.0 | |
| 11 | Quartz | — | Absence | 39.0 | |

(Note)
(1) The spraying is carried out by a plasma spraying process under an atmospheric pressure and the thickness of undercoat is 80 μm and the thickness of top coat such as $Y_2O_3$, $Al_2O_3$ or the like is 200 μm.
(2) Material of undercoat is 80% Ni—20% Al.
(3) Anodizing is carried out according to AA25 defined in JIS H8601.

Example 3

In this example, 80% Ni-20% Al of 80 μm in thickness as an undercoat, $Al_2O_3$ or a mixture of $Al_2O_3$ 50 vol %/$Y_2O_3$ 50 vol % of 100 μm as a middle layer and $Y_2O_3$ of 200 μm in thickness are formed on an aluminum substrate of width 50 mm×length 100 mm×thickness 5 mm by a plasma spraying process under an atmospheric pressure, respectively, and then a plasma erosion test is carried out under the same conditions as in Example 2.

As a result, since the $Y_2O_3$ sprayed coating is formed on the outermost surface layer portion (top coat), even when $Al_2O_3$ or the mixture layer of $Al_2O_3/Y_2O_3$ is formed as the middle layer, the resistance to plasma erosion is not influenced in the sprayed coating according to the invention and only a loss of 6.1–7.5 μm is observed by irradiation for 20 hours, and hence it is recognized to develop sufficient performances even in the multilayer structure coating.

Example 4

In this example, with respect to a test piece obtained by anodizing the existing aluminum substrate (alumite treatment) and a test piece formed by covering a 80% Ni-20% Al alloy coating of 100 μm in thickness on the substrate as an undercoat and coating a $Y_2O_3$ coating of 250 μm in thickness thereon as a top coat through plasma spraying process is carried out a plasma etching under the following conditions to measure the number of particles flied through the etching as particle numbers adhered onto a surface of a silicon wafer of 8 inches in diameter placed on the same chamber. Moreover, the number of particles adhered is examined by a surface inspection apparatus based on particles having a particle size of not less than approximately 0.2 μm.

(1) Environmental gas and flow rate condition

A mixed gas of $CHF_3$, $O_2$ and Ar is an atmosphere under the condition.

$CHF_3/O_2/Ar$=80/100/160 (flow rate cm3 per 1 minute)

(2) Plasma Irradiation Output

High frequency power: 1300 W
Pressure: 4 Pa
Temperature: 60° C.

As a result of this experiment, in the anodized test piece (alumite film), the particle number exceeds 30 particles as a particle control value in the general chamber after 17.5 hours of the plasma irradiation and is not less than 150 particles after 25 hours. The composition of the particle consists of Al and F.

On the contrary, in the $Y_2O_3$ sprayed coating according to the invention, the particle number only exceeds the control limit value even after 70 hours of the irradiation and the excellent resistance to plasma erosion is indicated.

INDUSTRIAL APPLICABILITY

As mentioned above, according to the invention, the member obtained by directly forming $Y_2O_3$ sprayed coating on the metallic or non-metallic substrate or by forming a metallic undercoat and then forming $Y_2O_3$ sprayed coating shows an excellent resistance when it is used under an environment subjected to plasma erosion action in a gas atmosphere containing a halogen compound. To this end, even when plasma etching operation is continued over a long time, the contamination through particles in the chamber is less and it is possible to efficiently produce a high quality product. And also, the contamination rate of the particle in the chamber becomes slower, so that the interval for the cleaning operation becomes long and the improvement of the productivity can be expected. As a result, the members according to the invention are very effective as an internal member for a plasma treating vessel in the field of semiconductor production apparatus, liquid crystal device or the like.

What is claimed:

1. An internal member for a plasma treating vessel comprising a substrate and a $Y_2O_3$ reduced-pressure plasma sprayed coating covered on a surface thereof.

2. An internal member for a plasma treating vessel according to claim 1, wherein a pressure in the reduced-pressure plasma spraying is 50–200 hPa.

3. An internal member for a plasma treating vessel according to claim 1, wherein an atmosphere in the reduced-pressure plasma spraying is an Ar gas atmosphere.

4. An internal member for a plasma treating vessel comprising an Al substrate and a $Y_2O_3$ sprayed coating covered on a surface thereof, in which the $Y_2O_3$ sprayed coating has a porosity of 0.2–10%.

5. An internal member for a plasma treating vessel according to claim 1, wherein the $Y_2O_3$ has a purity of not less than 95%.

6. An internal member for a plasma treating vessel comprising a substrate, a Ni-containing undercoat formed on a surface thereof, and a $Y_2O_3$ sprayed coating formed on the undercoat as a top coat.

7. An internal member for a plasma treating vessel comprising a substrate, a Ni alloy-containing undercoat formed on a surface thereof, and a $Y_2O_3$ sprayed coating formed on the undercoat as a top coat.

8. An internal member for a plasma treating vessel comprising a substrate, a W-containing undercoat formed on a surface thereof, and a $Y_2O_3$ sprayed coating formed on the undercoat as a top coat.

9. An internal member for a plasma treating vessel comprising a substrate, a W alloy-containing undercoat formed on a surface thereof, and a $Y_2O_3$ sprayed coating formed on the undercoat as a top coat.

10. An internal member for a plasma treating vessel comprising a substrate, a Ti-containing undercoat formed on a surface thereof, and a $Y_2O_3$ sprayed coating formed on the undercoat as a top coat.

11. An internal member for a plasma treating vessel comprising a substrate, a Ti alloy-containing undercoat formed on a surface thereof, and a $Y_2O_3$ sprayed coating formed on the undercoat as a top coat.

12. An internal member for a plasma treating vessel comprising a substrate, an undercoat formed on a surface thereof through a spraying process, and a $Y_2O_3$ sprayed coating formed on the undercoat as a top coat.

13. A method of producing an internal member for a plasma treating vessel, which comprises covering $Y_2O_3$ on a surface of a substrate through a reduced-pressure plasma spraying process to form a $Y_2O_3$ reduced-pressure plasma sprayed coating.

14. A method of producing an internal member for a plasma treating vessel according to claim 13, wherein a pressure in the reduced-pressure plasma spraying is 50–200 hPa.

15. A method of producing an internal member for a plasma treating vessel according to claim 13, wherein an atmosphere in the reduced-pressure plasma spraying is an Ar gas atmosphere.

16. A method of producing an internal member for a plasma treating vessel, which comprises forming an undercoat on a surface of a substrate through a spraying process and forming a $Y_2O_3$ sprayed coating on the undercoat as a top coat.

17. An internal member for a plasma treating vessel comprising a substrate, a mixed coating of $Al_2O_3$ and $Y_2O_3$ formed on a surface thereof, and a $Y_2O_3$ sprayed coating formed on the mixed coating.

18. An internal member for a plasma treating vessel according to claim 17, wherein the substrate is a metal.

19. An internal member for a plasma treating vessel according to claim 18, wherein the metal is Al.

20. An internal member for a plasma treating vessel according to claim 18, wherein the metal is an Al alloy.

21. An internal member for a plasma treating vessel according to claim 17, wherein the mixed coating is formed through a spraying process.

22. An internal member for a plasma treating vessel comprising a substrate, an $Al_2O_3$ coating formed on a surface of the substrate, and a sprayed coating of $Y_2O_3$ formed thereon.

23. An internal member for a plasma treating vessel according to claim 22, wherein the substrate is a metal.

24. An internal member for a plasma treating vessel according to claim 23, wherein the metal is Al.

25. An internal member for a plasma treating vessel according to claim 23, wherein the metal is an Al alloy.

26. An internal member for a plasma treating vessel according to claim 22, wherein the $Al_2O_3$ coating is formed through a spraying process.

27. A method of producing an internal member for a plasma treating vessel, which comprises forming a mixed coating of $Al_2O_3$ and $Y_2O_3$ on a surface of a substrate, and covering $Y_2O_3$ on a surface of the mixed coating through a spraying process to form a $Y_2O_3$ sprayed coating.

28. A method of producing an internal member for a plasma treating vessel according to claim 27, wherein the mixed coating of $Al_2O_3$ and $Y_2O_3$ is formed through a spraying process.

29. A method of producing an internal member for a plasma treating vessel, which comprises covering and forming an $Al_2O_3$ coating on a surface of a substrate, and covering $Y_2O_3$ on a surface of the $Al_2O_3$ coating through a spraying process to form a $Y_2O_3$ sprayed coating.

30. A method of producing an internal member for a plasma treating vessel according to claim 29, wherein the $Al_2O_3$-containing coating is formed through a spraying process.

* * * * *

UNITED STATES PATENT AND TRADEMARK OFFICE
CERTIFICATE OF CORRECTION

PATENT NO.        : 6,884,516 B2
APPLICATION NO. : 10/849797
DATED             : April 26, 2005
INVENTOR(S)      : Yoshio Harada et al.

It is certified that error appears in the above-identified patent and that said Letters Patent is hereby corrected as shown below:

On the Title page of the printed patent, paragraph Item [75] Inventors, lines 1-5, "Yoshio Harada, Hyogo (JP); Junichi Takeuchi, Hyogo (JP); Tatsuya Hamaguchi, Kanagawa (JP); Nobuyuki Nagayama, Yamanashi (JP); Kouji Mitsuhashi, Yamanashi (JP)" should be --Yoshio Harada, Hyogo (JP); Junichi Takeuchi, Hyogo (JP); Nobuyuki Nagayama, Yamanashi (JP); Kouji Mitsuhashi, Yamanashi (JP)--.

Signed and Sealed this

Tenth Day of July, 2007

JON W. DUDAS
*Director of the United States Patent and Trademark Office*